(12) United States Patent
Fischer et al.

(10) Patent No.: US 7,895,482 B2
(45) Date of Patent: Feb. 22, 2011

(54) EMBEDDED MEMORY REPAIR

(75) Inventors: Frederick Harrison Fischer, Macungie, PA (US); Richard P. Martin, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 292 days.

(21) Appl. No.: 12/160,505

(22) PCT Filed: Apr. 26, 2007

(86) PCT No.: PCT/US2007/067510

§ 371 (c)(1),
(2), (4) Date: Jul. 10, 2008

(87) PCT Pub. No.: WO2008/133680

PCT Pub. Date: Nov. 6, 2008

(65) Prior Publication Data

US 2010/0157703 A1  Jun. 24, 2010

(51) Int. Cl.
*G11C 29/00* (2006.01)
(52) U.S. Cl. .................................................... 714/710
(58) Field of Classification Search ........................ None
See application file for complete search history.

(56) References Cited

U.S. PATENT DOCUMENTS 5,805,789 A * 9/1998 Huott et al. .................... 714/7
5,917,764 A * 6/1999 Ohsawa et al. .............. 365/200
5,987,632 A    11/1999 Irrinki et al.

(Continued)

FOREIGN PATENT DOCUMENTS

EP    1624465    2/2006

(Continued)

OTHER PUBLICATIONS

V. Schöber et al., "Memory Built-In Self-Repair," Infineon Technologies, www.item.uni-bremen.de/itg-fg5/workshop_13/papers/schoeber.pdf, pp. 1-4.

*Primary Examiner*—Robert Beausoliel
*Assistant Examiner*—Guerrier Merant
(74) *Attorney, Agent, or Firm*—Ryan, Mason & Lewis, LLP (57) ABSTRACT

A memory repair circuit for repairing one or more failures in an embedded memory includes at least one fuse register and state machine circuitry coupled to the fuse register. The state machine circuitry implements a first state machine operative: (i) to receive status information regarding the one or more failures in the embedded memory; (ii) to determine whether the memory is repairable based on the status information; (iii) when the memory is deemed repairable, to store an address corresponding to a failed memory cell of the memory; (iv) to burn the address corresponding to the failed memory cell into the fuse register using a voltage source supplied to the memory repair circuit; and (v) to verify that the address corresponding to the failed memory cell was burned into the fuse register. The state machine circuitry further implements a second state machine operative: (i) to download information stored in the at least one fuse register into at least one repair register associated with the embedded memory; and (ii) when an address is received in the circuit corresponding to a failed memory instance in the embedded memory, to reroute access to the failed memory instance to the at least one repair register.

22 Claims, 8 Drawing Sheets

U.S. PATENT DOCUMENTS

| | | | |
|---|---|---|---|
| 6,145,092 A * | 11/2000 | Beffa et al. ................... 714/7 |
| 6,154,851 A | 11/2000 | Sher et al. |
| 6,157,583 A * | 12/2000 | Starnes et al. ............... 365/200 |
| 6,166,981 A | 12/2000 | Kirihata et al. |
| 6,367,042 B1 | 4/2002 | Phan et al. |
| 6,408,401 B1 * | 6/2002 | Bhavsar et al. ................ 714/7 |
| 6,871,297 B2 | 3/2005 | Puri et al. |
| 6,898,143 B2 * | 5/2005 | Puri et al. ................ 365/225.7 |
| 6,927,591 B2 | 8/2005 | McCord |
| 7,053,470 B1 | 5/2006 | Sellers et al. |
| 2001/0014040 A1 * | 8/2001 | Ooishi ....................... 365/200 |
| 2001/0017806 A1 * | 8/2001 | Schamberger et al. ...... 365/202 |
| 2004/0123181 A1 * | 6/2004 | Moon et al. .................... 714/13 |
| 2005/0018517 A1 * | 1/2005 | Collura et al. ........... 365/225.7 |
| 2005/0047253 A1 | 3/2005 | Puri et al. |
| 2005/0138513 A1 | 6/2005 | Mondal et al. |
| 2005/0149782 A1 | 7/2005 | McPartland |
| 2007/0047347 A1 * | 3/2007 | Byun et al. ................. 365/201 |
| 2007/0103977 A1 * | 5/2007 | Conley et al. .......... 365/185.09 |
| 2008/0019198 A1 * | 1/2008 | Co et al. ..................... 365/201 |
| 2008/0065929 A1 * | 3/2008 | Nadeau-Dostie et al. ....... 714/5 |

FOREIGN PATENT DOCUMENTS

WO 2007/067510 1/2008

* cited by examiner

EMBEDDED MEMORY REPAIR

FIELD OF THE INVENTION

The present invention relates generally to techniques for increasing yield in semiconductor devices, and more particularly relates to techniques for repairing embedded memory in an integrated circuit (IC).

BACKGROUND OF THE INVENTION

Semiconductor memory devices, including, for example, read-only memory (ROM), random access memory (RAM), etc., typically include an array of memory cells arranged in rows and columns. Each of the memory cells stores information, often referred to as a bit, in one of two logic states, namely, a logic high state (a logic "1") and a logic low state (a logic "0"). To access the information stored in a given memory cell, a unique address is utilized. The memory address for each memory cell typically incorporates the particular row and column location of the memory cell in the memory array.

With process technologies pushing well into deep-submicron geometries, IC designers can integrate significant densities of memory and logic together on the same chip. In doing so, they have ushered in the system-on-a-chip (SoC) era. As part of the manufacturing process, a memory device is tested by applying one or more test patterns, often referred to as a test series, to the device and noting any unexpected results as errors. Densely packing the memory cells makes them prone to manufacturing failures. An IC with equal areas of embedded memory and logic (as in the case of SoC technologies) is likely to fail due to manufacturing defects in memory twice as often as it will fail due to defects in logic. Consequently, in SoC ICs having both embedded memory and logic, it is the memory that determines, to a large extent, the overall yield of the ICs.

In order to increase yield, it is known to design a certain amount of redundancy into an IC device having embedded memory. This redundancy is usually provided in the form of spare blocks of memory cells. Accordingly, once an address corresponding to a defective memory cell is identified, it is typically rerouted to a redundant memory cell in the memory array. For this rerouting, the defective memory address is typically programmed into a fuse or antifuse register, the latter being particularly applicable to repair a defective die after encapsulation. In this manner, if an address is provided to a memory device and this address matches a programmed defective address stored in a register of the device, the register, which is associated with a redundant memory location in the array, reroutes the access to the redundant location.

Ideally, there is a redundant memory cell for every memory cell in the memory array. However, the inclusion of redundant memory cells in an IC can undesirably increase the size of the IC. Additionally, overhead logic is generally required to implement a redundant memory architecture. Thus, there is a trade-off between increased yield on the one hand and increased chip size and complexity on the other hand.

Accordingly, there exists a need for improved embedded memory repair techniques which do not suffer from one or more of the above-described problems associated with conventional memory repair techniques.

SUMMARY OF THE INVENTION

The present invention, in illustrative embodiments thereof, comprises techniques for efficiently repairing embedded memory in an IC. A pair of state machines is employed to automatically program fuse registers based on memory built-in self-test (MBIST) results associated with the embedded memory and to download the information programmed into the fuse registers for performing a rerouting of memory addresses corresponding to failed memory instances in the embedded memory.

In accordance with one aspect of the invention, a memory repair circuit for repairing one or more failures in an embedded memory includes at least one fuse register and state machine circuitry coupled to the fuse register. The state machine circuitry implements a first state machine operative: (i) to receive status information regarding the one or more failures in the embedded memory; (ii) to determine whether the memory is repairable based on the status information; (iii) when the memory is deemed repairable, to store an address corresponding to a failed memory cell of the memory; (iv) to burn the address corresponding to the failed memory cell into the fuse register using a voltage source supplied to the memory repair circuit; and (v) to verify that the address corresponding to the failed memory cell was burned into the fuse register.

The state machine circuitry further implements a second state machine operative: (i) to download information stored in the at least one fuse register into at least one repair register associated with the embedded memory; and (ii) when an address is received in the circuit corresponding to a failed memory instance in the embedded memory, to reroute access to the failed memory instance to the at least one repair register. At least a portion of the memory repair circuit may be implemented in an IC device.

In accordance with another aspect of the invention, an automated test equipment (ATE) apparatus for use in connection with a memory repair circuit for repairing one or more failures in an embedded memory includes a programmable voltage source and at least one processor coupled to the programmable voltage source. The processor is operative: (i) to generate a first control signal, the first control signal being supplied to the memory repair circuit for initiating an automated memory repair procedure in the memory repair circuit; (ii) to receive, from the memory repair circuit, status information relating to a memory built-in self-test (MBIST) procedure performed on the embedded memory; (iii) to determine, based at least in part on the status information, whether the embedded memory is repairable; (iv) when the embedded memory is determined to be repairable, to set the programmable voltage source to a first voltage level at least equal to a minimum voltage potential suitable for burning at least one fuse register in the memory repair circuit and to generate a second control signal, the second control signal being supplied to the memory repair circuit for initiating an automated fuse burn procedure for programming the at least one fuse register; (v) to receive a first acknowledgment indicating whether the fuse burn procedure has been completed; (vi) in response to the first acknowledgment that the fuse burn procedure has been completed, to set the programmable voltage source to a second voltage level which is less than the minimum voltage potential suitable for burning the at least one fuse register; (vii) to generate a third control signal, the third control signal being supplied to the memory repair circuit for initiating an automated verification procedure in the memory repair circuit for verifying data burned into the at least one fuse register; and (viii) to receive a second acknowledgment indicating a result of the verification procedure.

In accordance with yet another aspect of the invention, a system for repairing one or more failures in an embedded memory includes an ATE apparatus and at least one circuit to be tested using the ATE apparatus. The circuit includes embedded memory and a memory repair circuit coupled to the embedded memory. The memory repair circuit includes at least one fuse register and state machine circuitry coupled to the fuse register. The state machine circuitry implements a first state machine operative: (i) to receive status information regarding the one or more failures in the embedded memory; (ii) to determine whether the memory is repairable based on the status information; (iii) when the memory is deemed repairable, to store an address corresponding to a failed memory cell of the memory; (iv) to burn the address corresponding to the failed memory cell into the fuse register using a voltage source supplied to the memory repair circuit by the ATE apparatus; and (v) to verify that the address corresponding to the failed memory cell was burned into the fuse register.

The state machine circuitry further implements a second state machine operative: (i) to download information stored in the at least one fuse register into at least one repair register associated with the embedded memory; and (ii) when an address is received in the circuit corresponding to a failed memory instance in the embedded memory, to reroute access to the failed memory instance to the at least one repair register.

These and other features, objects and advantages of the present invention will become apparent from the following detailed description of illustrative embodiments thereof, which is to read in connection with the accompanying drawings.

DETAILED DESCRIPTION OF THE INVENTION

The present invention will be described herein in the context of exemplary methods and apparatus for repairing embedded memory in an IC device so as to increase a manufacturing yield of functioning devices. It is to be understood, however, that the techniques of the present invention are not limited to the methods and apparatus shown and described herein.

A "device" as the term is used herein may comprise, by way of example only and without limitation, elements such as those commonly associated with an application-specific integrated circuit (ASIC), single inline memory module (SIMM), dual inline memory module (DIMM), content-addressable memory (CAM), central processing unit (CPU), digital signal processor (DSP), or any other type of data processing or storage device, as well as portions and/or combinations of such elements having embedded memory. A "memory" as the term is used herein is intended to refer broadly to any element that can be employed to at least temporarily store information (e.g., data), typically in binary form although not limited thereto, and may include, for example, volatile memory (e.g., dynamic random access memory (DRAM), static random access memory (SRAM), etc.) and non-volatile memory (e.g., flash memory, read-only memory (ROM), magnetic random access memory (MRAM), etc.).

Figure 1:
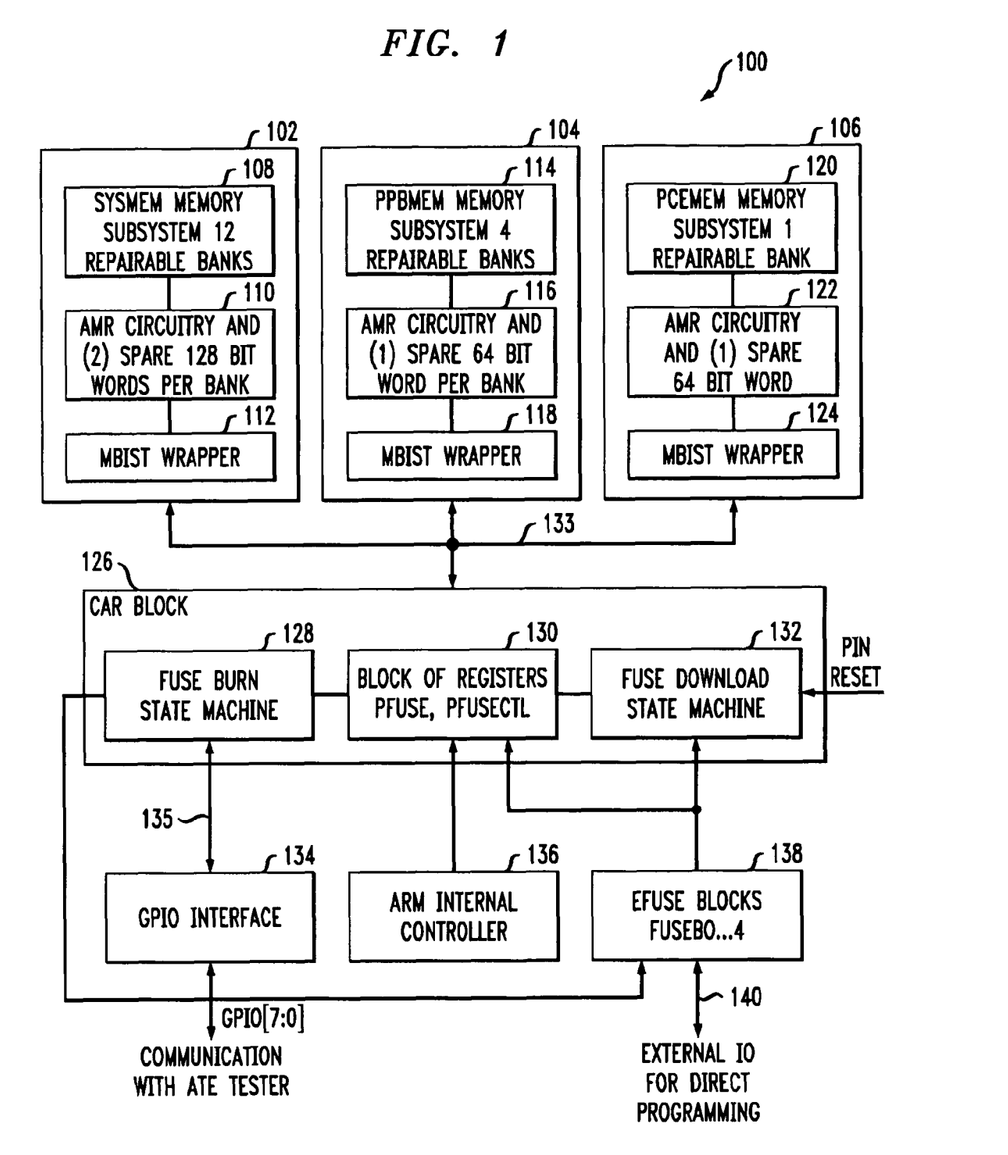
FIG. 1 is a block diagram of an exemplary memory circuit including embedded memory, formed in accordance with an embodiment of the invention.

FIG. 1 is a block diagram depicting at least a portion of an exemplary memory circuit 100 in which techniques of the present invention are implemented. Memory circuit 100 includes embedded memory which may be organized into a plurality of embedded memory groups, namely, a first embedded memory group 102, a second embedded memory group 104, and a third embedded memory group 106. The invention, however, is not limited to the specific number of embedded memory groups shown, but may be utilized with fewer embedded memory groups (e.g., 2) or a greater number of embedded memory groups (e.g., 4), as will become apparent to those skilled in the art.

First embedded memory group 102 preferably includes a system memory subsystem (SYSMEM) 108 comprising a plurality of memory cells (which may be arranged, for example, as 128-bit words) and twelve repairable memory banks which are grouped together and have associated adaptive memory repair (AMR) circuitry 110 coupled to the system memory subsystem. Memory subsystem 108 is further coupled to MBIST controller wrapper logic 112. AMR circuitry 110 preferably comprises two spare 128-bit words per bank and compare logic which can be utilized for repairing one or more defective memory cells in memory subsystem 108. The MBIST controller wrapper logic 112 is preferably adapted to run procedures (e.g., software routines, etc.) for functionally testing memory subsystem 108.

Second and third embedded memory groups 104 and 106, respectively, may be organized in a manner similar to the first embedded memory group 102. More particularly, second embedded memory group 104 preferably includes a packet processing block (PPB) memory subsystem (PPBMEM) 114 comprising a plurality of memory cells (which may be arranged, for example, as 64-bit words) and four repairable memory banks which are grouped together and have associated AMR circuitry 116 coupled to the PPBMEM memory subsystem. Memory subsystem 114 is further wrapped by MBIST controller wrapper logic 118. AMR circuitry 110 preferably comprises one spare 64-bit word per bank and compare logic which can be utilized for repairing one or more defective memory cells in memory subsystem 114. Likewise, third embedded memory group 106 preferably includes a packet classifier engine (PCE) memory subsystem (PCEMEM) 120 comprising a plurality of memory cells (which may be arranged, for example, as 64-bit words) and one repairable memory bank which are grouped together and have associated AMR circuitry 122 coupled to the PCEMEM memory subsystem. Memory subsystem 120 is further wrapped by MBIST controller wrapper logic 124. AMR circuitry 122 preferably comprises one spare 64-bit word per bank and compare logic which can be utilized for repairing one or more defective memory cells in memory subsystem 120.

It is to be understood that the invention is not limited to the number and/or arrangement (size, array configuration, etc.) of the embedded memory groups; nor are the respective memory subsystems limited to any particular number or organization of memory cells and/or spare words. There can be any number of memory instances (1 to n, where n is an integer greater than 1) in each of the memory subsystems 108, 114, 120. Furthermore, the number of memory instance in each of the memory subsystems need not be the same relative to one another. Any number of memory subsystems can be accommodated using the techniques of the present invention, such as, for example, by modifying the first state machine and supporting circuitry.

In general, the memory subsystems 108, 114 and 120 may be functionally tested by using a series of pattern inputs, often referred to as test patterns. The pattern inputs can be generated by testing logic included in the MBIST wrapper logic 112, 118 and 124 associated with the memory subsystems 108, 114 and 120, respectively, as is conventionally done, in such a manner as to cause the memory subsystems, when functioning in accordance with acceptable operational limits, to produce predictable outputs in response to the respective pattern inputs. The testing logic, in turn, compares a pattern output generated by the respective memory subsystems in response to each pattern input with an expected output and, if any portion of the output does not match, preferably outputs and/or stores the address at which the detected error occurred and the bit(s) affected.

Memory circuit 100 further includes a clock and reset (CAR) register block 126. CAR block 126 comprises a first state machine 128, which may be a fuse burn state machine, a second state machine 132, which may be a fuse download state machine, and a block of registers (e.g., PFUSE, PFUSECTL) 130 operatively coupled to the first and second state machines. The block of registers 130 is not limited to any particular number of registers. CAR block 126 is preferably operative to communicate with embedded memory groups 102, 104 and 106 via a bus 133, or alternative connection means. Bus 133 is preferably a bidirectional connection so as to convey data between the respective embedded memory groups 102, 104, 106, and CAR block 126. CAR block 126 may be coupled to a general purpose input/output (GPIO) interface 134 via connection 135. GPIO interface 134 is preferably adapted to pass status and/or control information between external automated test equipment (ATE) and the internal state machines 128 and 132.

The interface between the ATE and GPIO interface 134 may be by way of a bus comprised of multiplexed input/output (IO) pins GPIO[7:0] associated with the memory circuit 100, or an alternative connection arrangement (e.g., wired or wireless). Preferably, data is transferred between the fuse burn state machine and the ATE serially in order to minimize the number of IO pins required at any given time, although essentially any data communication means is contemplated by the invention. A serial data transfer approach is particularly advantageous in this instance since an IC device is typically limited to the number of IO pins included therein. The GPIO pins are preferably configured as inputs in a default state. GPIO[2:0] are normally used as inputs anyway, and thus need not be changed, but the other GPIO pins, namely, GPIO[7:3], are used in this illustrative embodiment as outputs and therefore would be changed to function as output pins at an appropriate time, as will become apparent to those skilled in the art. It is to be appreciated that the invention is not limited to an IO bus having any specific number of pins.

Memory circuit 100 includes an electronic fuse (eFuse) array 138 which comprises a plurality of fuse blocks (e.g., FUSEB0 through FUSEB4), although the invention is not limited to any particular number of fuse blocks. Electronic fuse array 138 is coupled to first state machine 128, second state machine 132 and to the block of registers 130. First state machine 128 preferably provides the clock, program data, protection bit and chip select to the electronic fuse array 138.

The electronic fuse array 138 accepts a serial stream of data and control information in order to burn the entire fuse array. Data to be programmed into the fuse array is preferably provided by the MBIST wrapper logic 112, 118 and 124 in each of the embedded memory groups 102, 104 and 106, respectively, which contain the status and possible defective address. The electronic fuse array 138 provides a nonvolatile approach to storing defective memory address information. Electronic fuse array 138 may include an IO connection 140 for providing external access for direct programming of the fuse blocks.

Optionally, memory circuit 100 may also include an internal advanced reduced instruction set code (RISC) machine (ARM) controller 136, or an alternative controller, operatively coupled to the block of registers 130. ARM controller 136 provides a mechanism for performing a "soft" memory repair by directly reading from or writing to the block of registers 130 through software programming. This is a volatile register-based approach as opposed to the nonvolatile eFuse approach provided by electronic fuse array 138. The ARM controller 136 is driven by software (hence the term "soft" memory repair) that offers flexibility but is not automatically invoked. Moreover, the soft repair approach generally lacks the speed and efficiency of a hardware-based state machine approach.

The second state machine 132 preferably includes an input for receiving a control signal, Pin Reset, which may be supplied by an ATE tester or alternative control circuitry. The Pin Reset signal preferably initiates the fuse download process in the second state machine 132 which transfers the programmed contents of the electronic fuse array 138 and distributes the contents to the appropriate AMR circuitry to enable memory repair. The internal chip circuitry, except for the memory repair circuitry, is held in a reset state until the download has been completed. After the internal reset is released, the redundancy is enabled and the memory circuit 100 is ready for functional use.

The portion of the exemplary memory circuit 100 shown in FIG. 1 is considerably simplified for clarity of illustration. It should also be understood, however, that the particular arrangements of elements shown in the figures and described herein are by way of illustrative example only. More specifically, the invention can be implemented in any of a number of forms, and is not limited to any particular device-testing application.

In accordance with an aspect of the invention, an exemplary fuse burn sequence, as may be performed by fuse burn state machine 128, will now be described. The embedded memory in the memory circuit 100 is first tested using on-chip MBIST logic (e.g., LogicVision, JTAG/IEEE 1149.1, etc.). Fuse burn state machine 128 is preferably operative to evaluate the MBIST status of the individual embedded memory groups and to determine whether or not the memory circuit is repairable. To accomplish this, the fuse burn state machine 128 preferably checks to see whether the number of failures detected is at or below a predetermined threshold number. This threshold number may be a function of, for example, the number of repairable memory banks in the memory circuit, among other criteria.

If it is determined that the memory circuit 100 is repairable (e.g., the number of detected failures is below the predetermined threshold number), the fuse burn state machine 128 sends an MBIST status signal to the ATE tester. This status signal may be a two-bit signal indicative of the memory circuit being characterized as one of three types, namely, a functioning part, a bad part, or a repairable part. The fuse burning methodology performed in accordance with an embodiment of the invention will only be concerned with repairable parts. Upon receiving the MBIST status signal from the fuse burn state machine indicating a repairable part, the ATE tester preferably activates a fuse burn (programming) voltage source and supplies this voltage to the fuse burn state machine 128 in the memory circuit 100. The fuse burn voltage source is preferably set to a voltage level (e.g., 2.5 volts) which is suitable for burning the fuses. The memory circuit 100 may include write protection circuitry, or alternative control circuitry, to ensure that even when this fuse burn voltage is supplied to the chip by the ATE, the fuse banks are not able to be inadvertently programmed until the fuse burn state machine is ready.

Addresses corresponding to failed memory instances in the memory circuit 100 are preferably programmed into the electronic fuse array 138 serially, although a parallel programming methodology is similarly contemplated by the invention, as will become apparent to those skilled in the art. The advantages of a serial programming approach is that the number of IO pins required for burning the fuses can be substantially minimized compared to a parallel programming approach. Once the fuses are burned, the fuse burn state machine 128 sends an acknowledgment back to the ATE to disable (e.g., turn off) the fuse burn voltage source (e.g., by setting the fuse burn voltage to zero). The ATE then instructs the fuse burn state machine 128 to verify that the fuse blocks were burned in the correct manner. This can be accomplished, for example, by reading the respective fuse blocks and comparing the information with expected information corresponding thereto. The status of the verification process is then sent back to the ATE, thereby completing the burn process. Thus, the resultant memory repair information is stored in the nonvolatile fuse blocks of electronic fuse array 138.

In accordance with another aspect of the invention, an exemplary fuse download methodology, as may be performed by fuse download state machine 132, will now be described. Upon receiving a reset signal, such as, for example, from the ATE via the Pin Reset input, data programmed (e.g., burned) into the fuse array 138 is downloaded to an appropriate memory repair register associated with each memory subsystem. For each failed memory address in the memory circuit 100 there is a separate register which contains data corresponding to the failed address. When the memory circuit receives an address matching the failed address, read and/or write access is rerouted to the redundant memory location rather to the failed memory instance, thereby automatically effecting a repair of the memory circuit 100.

Figure 2A:
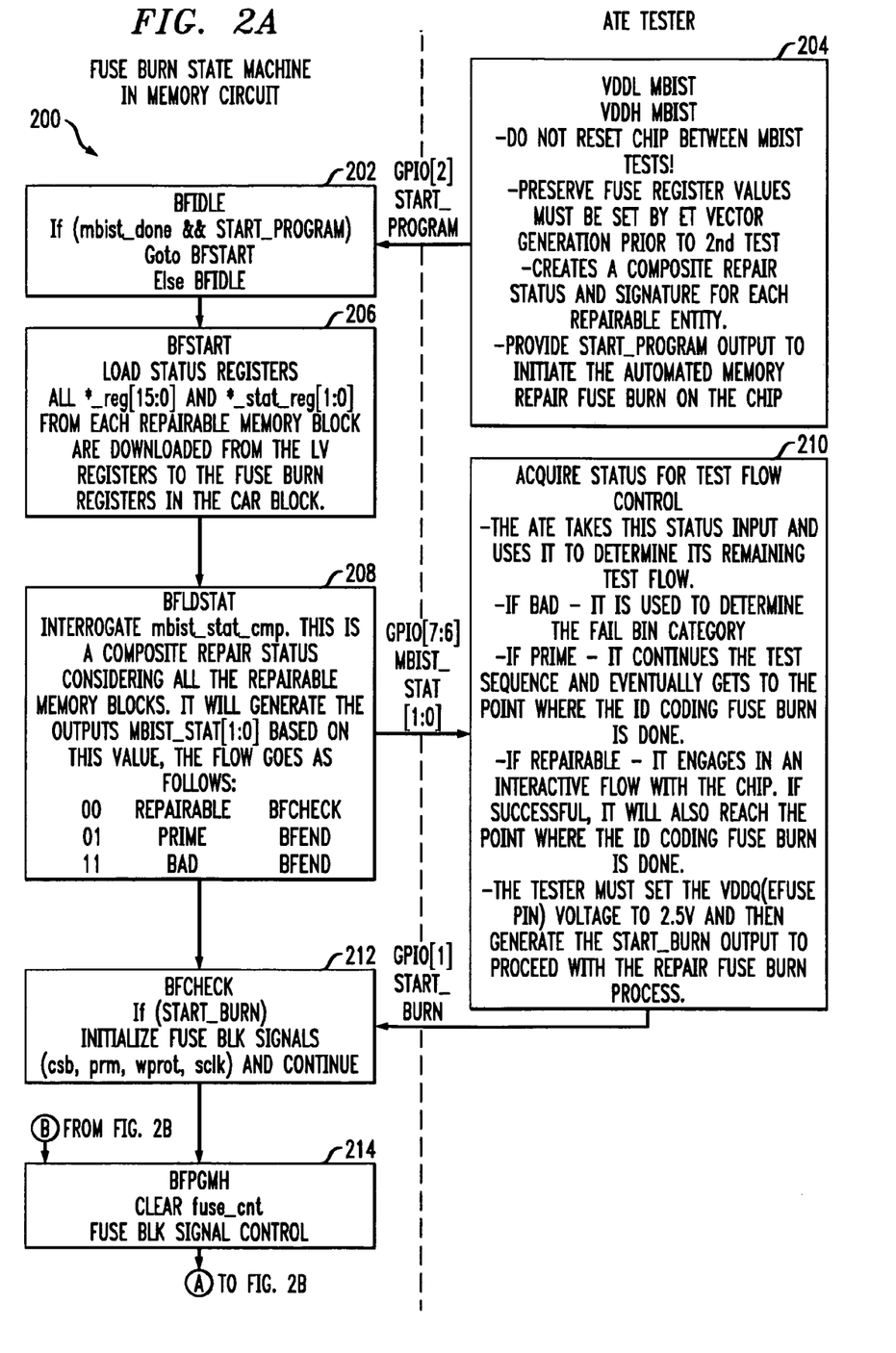
FIGS. 2A through 2C depict a state diagram illustrating an exemplary fuse burn state machine sequencer control/data flow which may be implemented in the memory circuit of FIG. 1, in accordance with an embodiment of the invention.
Figure 2B:
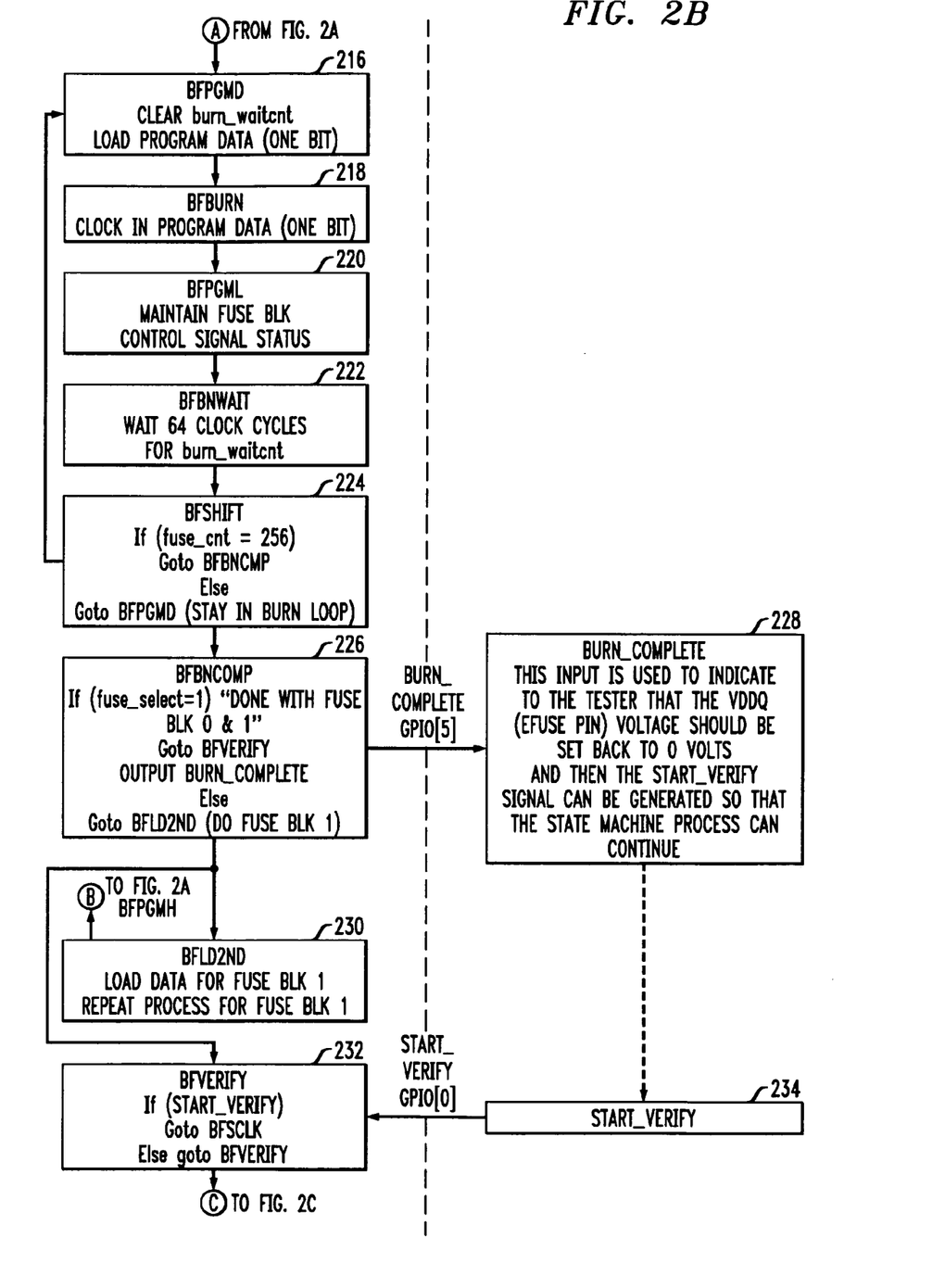
Figure 2C:
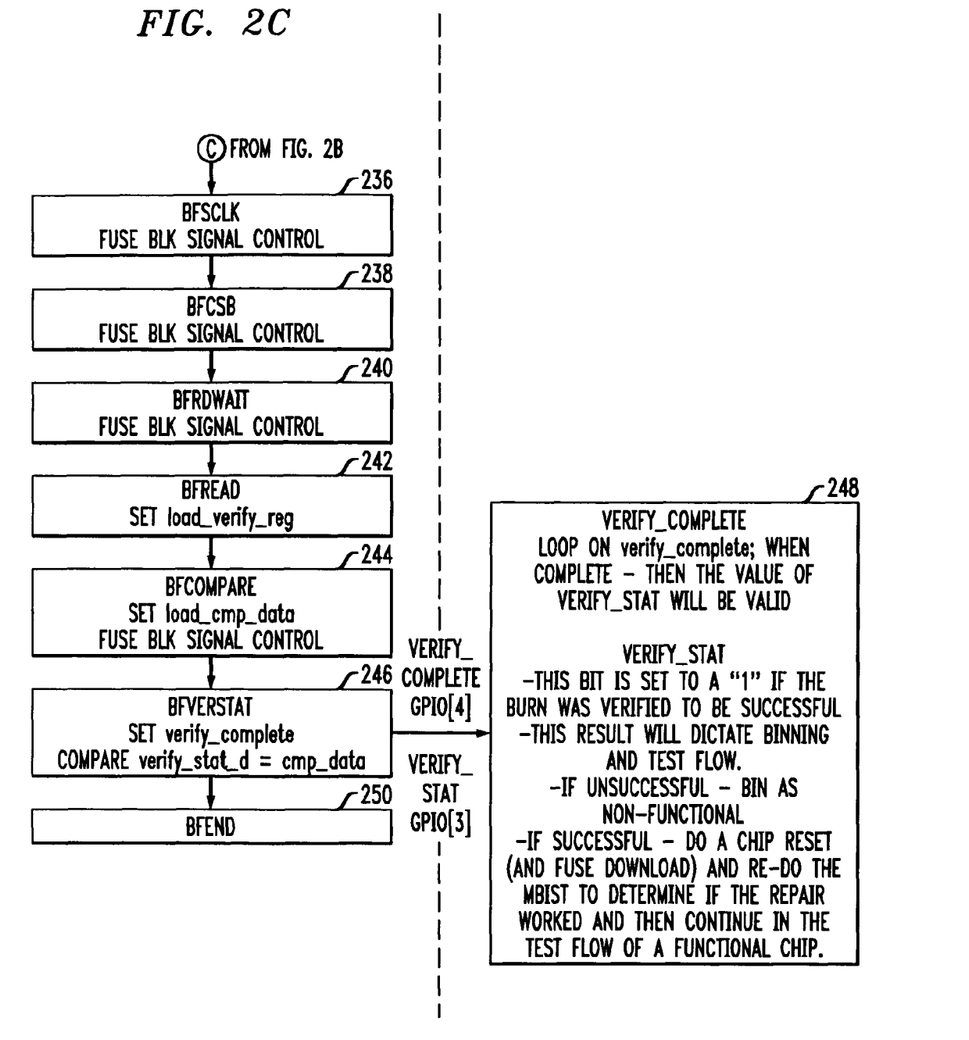

By way of example and without loss of generality, FIGS. 2A through 2C depict an exemplary fuse burn methodology 200 which may be performed, at least in part, by first state machine 128 in memory circuit 100 shown in FIG. 1, in accordance with an embodiment of the invention. In this illustrative methodology, it is assumed that there are two fuse blocks that can be burned, each fuse block containing 256 bits. Moreover, there is preferably a set of IO pins corresponding to each fuse block. It is to be understood, however, that the invention is not limited to any particular number or arrangement of fuse blocks in the memory circuit.

With reference to FIG. 2A, the fuse burn state machine preferably begins in an idle state (BFIDLE) 202, which is a default state entered on a reset condition. In state 202, the state machine sequencer waits for completion of the MBIST procedure and for a start signal, START_PROGRAM, from the ATE tester, or another external source, to initiate the automated fuse burn process in the memory circuit. When both of these conditions are satisfied, the state machine sequencer transitions to a start state (BFSTART) 204. In state 204, status information (e.g., defective memory addresses, etc.) from the MBIST wrapper or stored in, for example, LogicVision (LV) registers, or alternative storage elements, associated with each of the repairable memory blocks, is downloaded into temporary fuse burn registers in block 130 of the CAR block 126 (see FIG. 1). This status information is subsequently used to determine an overall chip status.

When downloading of the MBIST status information is complete, the fuse burn state machine sequencer transitions to a load status state (BFLDSTAT) 208. In state 208, the MBIST status information is evaluated to determine a repair status of the chip (e.g., to determine whether or not the memory repair methodology should be initiated). The results of the status evaluation, MBIST_STAT[1:0], may be grouped into three distinct classes: Prime (e.g., MBIST_STAT[1:0]=01), indicating that no failures were detected and therefore the memory repair methodology need not be initiated; Bad (e.g., MBIST_STAT[:0]=11), indicating that a number of failures exceeding a predetermined threshold was detected, the predetermined threshold preferably being equal to the number of redundant memory cells in the memory circuit; and Repairable (e.g., MBIST_STAT[1:0]=00), indicating that the number of failures detected is at or below the predetermined threshold, and therefore the memory repair methodology should be initiated. In this illustrative methodology, since there are three possible results, two bits are required as an MBIST status output. In this instance, GPIO[7:6] (pins 7 and 6 of the GPIO interface bus) are employed to output the results of the MBIST status evaluation MBIST_STAT[1:0] to the ATE. It is to be understood that if greater than four MBIST result classification are required, the MBIST status signal may employ more than two bits. Likewise, if only two result classifications are needed (e.g., repairable and not repairable), only one MBIST status bit may be used.

The MBIST status is used by the ATE for process flow control in the ATE (e.g., for determining the remaining test flow in the ATE), as depicted in step 210. More particularly, the MBIST status acquired from the fuse burn state machine in the memory circuit is used by the ATE: (i) to determine a fail bin category if the chip status indicates that the chip is bad; (ii) to continue with the test sequence and eventually complete an ID coding fuse burn methodology; and (iii) to engage in an interactive flow with the chip. When the MBIST status indicates that the chip is repairable, the ATE preferably activates a programmable fuse burn voltage source, which may be VDDQ, such as, for example, by increasing VDDQ from zero volts to a voltage level suitable for burning the fuses in the memory circuit (e.g., about 2.5 volts). After activating the fuse burn voltage source VDDQ, the ATE preferably generates a control signal, START_BURN, which is transmitted to the fuse burn state machine via the GPIO[1] IO pin.

When the MBIST status is indicative of the chip being prime or bad (e.g., MBIST_STAT[1:0]=01 or 11), the state machine sequencer need not perform the burn process, and the sequencer therefore transitions to an end state (BFEND) 250 (FIG. 2C), wherein the fuse burn method 200 ends. When the MBIST status is indicative of a repairable condition (e.g., MBIST_STAT[1:0]=00), the state machine sequencer transitions to a check or wait to start burn state (BFCHECK) 212, wherein fuse block signals, for example, csb, prm, wprot, and sclk, utilized by the fuse array 138 (FIG. 1) are initialized (e.g., csb=1, prm=1, wprot=0, sclk=0) to begin the fuse burn process. These illustrative signals correspond to signals specified by an exemplary fuse array macro, part number TEF65LP256X1S_I (commercially available from Taiwan Semiconductor Manufacturing Company, Ltd. (TSMC), suitable for use with the present invention. The invention, however, is not limited to use with any particular fuse array. The state machine sequencer waits at this point until an active START_BURN control signal is received from the ATE indicating that the ATE has activated the fuse burn voltage source VDDQ (e.g., VDDQ set to 2.5 volts) and that sequencer can begin the fuse burn process. When the active START_BURN control signal is received, the sequencer will turn on the fuse array via the chip select signal csb. The fuse array needs to go through a specific sequence in order to place the array into a program mode of operation. This ensures that the fuse array will not be inadvertently programmed; state 212 is the start of this sequence.

Next, the fuse burn state machine sequencer transitions to a program high state (BFPGMH) 214. In state 214, a program signal, prm, to the fuse array is set to a logic high level at least one clock cycle after the assertion of the chip select signal csb. Also, a first counter, fuse_cnt, is preferably cleared. The first counter tracks the number of bits in a given fuse block that have been programmed (e.g., burned). Other fuse block control signals are also set for fuse burning. For example, write protect signal wprot is set to 1 (active), and clock signal sclk remains at 0. The state machine sequencer then transitions to a program data state (BFPGMD) 216. In state 216, the correct data bit from the spare address temporary register is asserted. Also, a second counter, burn_waitcnt, is preferably cleared. This second counter functions to ensure that the fuse burn signal remains active (e.g., logic high) for a predetermined amount of time (e.g., about 5 microseconds) so as to enable the fuse blocks to be properly programmed. The present invention contemplates that alternative timing control circuitry (e.g., delay circuit, etc.) may be similarly employed. Program data is loaded serially, preferably in sequential bit order, although the invention is not limited to loading the data in any specific order; nor is the invention limited to serial data transfer, as previously stated (e.g., data may, alternatively, be loaded in parallel).

The sequencer continues to a burn state (BFBURN) 218, wherein the program data loaded in state 216 is clocked in for burning the appropriate fuse location (sclk=1). With reference to FIG. 2B, the sequencer then transitions to a program low state (BFPGML) 220. In state 220, as part of the burn process, the program signal prm is deasserted by setting prm to a logic low level before the serial clock sclk transitions from high to low to burn the next fuse bit. The state machine sequencer then transitions to a burn wait state (BFBNWAIT) 222.

In state 222, the value of the second counter burn_waitcnt is checked to determine if a predetermined threshold count has been reached. This threshold count is preferably indicative of a desired wait time for burning a fuse bit in the fuse blocks, such as, for example, 64 clock cycles in this illustrative embodiment. If the threshold number of clock cycles has not been reached, burn_waitcnt is incremented, for example, by one, and re-checked. The sequencer remains in state 222 until the threshold number of cycles (e.g., 64) has been reached. Thus, the serial clock sclk is held high for 64 clock cycles, at which point the sequencer transitions to a serial shift state (BFSHIFT) 224.

In state 224, the value of the first counter fuse_cnt is checked to determine if all 256 bits of a given fuse block have been programmed into the fuse array. If all 256 bits in the given fuse block have been burned, the sequencer will turn off the fuse array chip select (e.g., csb is set to a logic high level) and advance to a burn complete state (BFBNCOMP) 226. If all 256 bits of the given fuse block have not been burned, fuse_cnt is incremented and the sequencer transitions to state 216 to continue the fuse burn loop. With regard to the first and second counters, it is to be appreciated that rather than initially clearing the counter and then incrementing the counters until a predetermined threshold value is reached, as depicted in the figures, one or more of these counters can instead be preloaded with the respective desired threshold value and then decremented until a count value of zero is attained, as will be known by those skilled in the art.

In state 226, the fuse burn state machine sequencer checks to see whether all fuse blocks, namely, fuse blocks 0 and 1, have been programmed. If all fuse blocks have been burned, as may be indicated, for example, by a fuse_select counter, or alternative tracking means, an acknowledgment signal, BURN_COMPLETE, is generated by the fuse burn state machine in the memory circuit and sent to the ATE via multiplexed IO pin GPIO[5]. The state machine sequencer then jumps to a burn verification state (BFVERIFY) 232, wherein the sequencer waits for a control signal, START_VERIFY, from the ATE (e.g., via GPIO[0]). Alternatively, if the sequencer, in state 226, determines that not all fuse blocks in the fuse array have been burned, the fuse_select counter is incremented and the sequencer proceeds to a load second fuse data state (BFLD2ND) 230 to begin burning the second fuse block. In state 230, the state machine sequencer preferably loads the spare address information needed to program the second fuse block from the temporary register. The sequencer then initializes and turns on the second fuse block, and then jumps back to state 214 to begin burning the second fuse block. If more than two fuse blocks are used, this fuse burn process would repeat until all fuse blocks have been programmed.

As previously stated, the sequencer, in state 226, will generate a BURN_COMPLETE acknowledgment signal upon completion of the fuse burning process. The BURN_COMPLETE signal is utilized to indicate to the ATE, in step 228, that the fuse burn voltage source VDDQ should be turned off, such as by setting VDDQ back to zero volts, so as to disable further fuse burning. The ATE then generates, in step 234, the control signal, START_VERIFY, which is sent to the fuse burn state machine, via GPIO[0], so that the state machine sequencer can continue in state 232.

In state 232, the fuse burn state machine sequencer will wait until the ATE tester instructs it to start verifying the data programmed into the fuse array via the START_VERIFY control signal. Like the fuse burn loop process, there is a sequence that must be followed in order to read the fuse data. When the START_VERIFY signal goes to a logic high level on GPIO[0], the state machine sequencer advances to a serial clock high state (BFSCLK) 236, wherein the serial clock sclk is set to a logic high level. The sequencer then transitions to a chip select low state (BFCSB) 238, wherein all fuse blocks are turned on via the chip select signal csb being set to a logic low level. The sequencer then transitions to a read wait state (BFRDWAIT) 240, wherein the sequencer waits one clock cycle for the fuse blocks to turn on. With reference to FIG. 2C, the state machine sequencer next transitions to a fuse read state (BFREAD) 242. In state 242, data from the fuse array is loaded into temporary verify registers, load_verify_reg, which may reside in the block or registers 130 in the memory circuit 100 (see FIG. 1). The sequencer then transitions to a fuse compare state (BFCOMPARE) 244, wherein data from the spare address temporary registers is compared with corresponding data in the verify registers. If data in the two sets of registers match, a verify status register, verify_stat_d, or alternative acknowledgment indication, is preferably set to a first level (e.g., PASS) indicating that the fuse programming process was successful. If data in the two sets of registers does not match, the verify status register (verify_stat_d) will be set to a second level (e.g., FAIL) indicating that the fuse programming process was not successful. The sequencer then advances to a verify status state (BFVERSTAT) 246, wherein the sequencer transmits to the ATE a VERIFY_COMPLETE acknowledgment, via GPIO[4], indicating that the verification process has completed, and a VERIFY_STAT acknowledgment, via GPIO[3], indicating the status of the fuse verification process. The fuse array will also be powered down in state 246.

The state machine sequencer in the ATE tester, as depicted in step 248, preferably waits for the assertion of the verify_complete acknowledgment from the fuse burn state machine in the memory circuit, such as by looping on the value of verify_complete. The assertion of verify_complete indicates that the value of VERIFY_STAT is valid. The result of the VERIFY_STAT signal is preferably used to dictate binning and test flow in the ATE tester. For example, if VERIFY_STATE indicates that the fuse burning was unsuccessful, the ATE preferably bins the part as non-functional. If VERIFY_STAT indicates that the fuse burning was successful, the ATE preferably performs a chip reset (and accompanying fuse download) and re-runs the MBIST to determine if the repair was successful. The test flow then continues as a functional chip.

After transmitting the VERIFY_COMPLETE and VERIFY_STAT signals to the ATE in state 246, the fuse burn state machine sequencer advances to a burn fuse end state (BFEND) 250, where status, burn and verification of the fuse array has been competed.

Figure 3A:
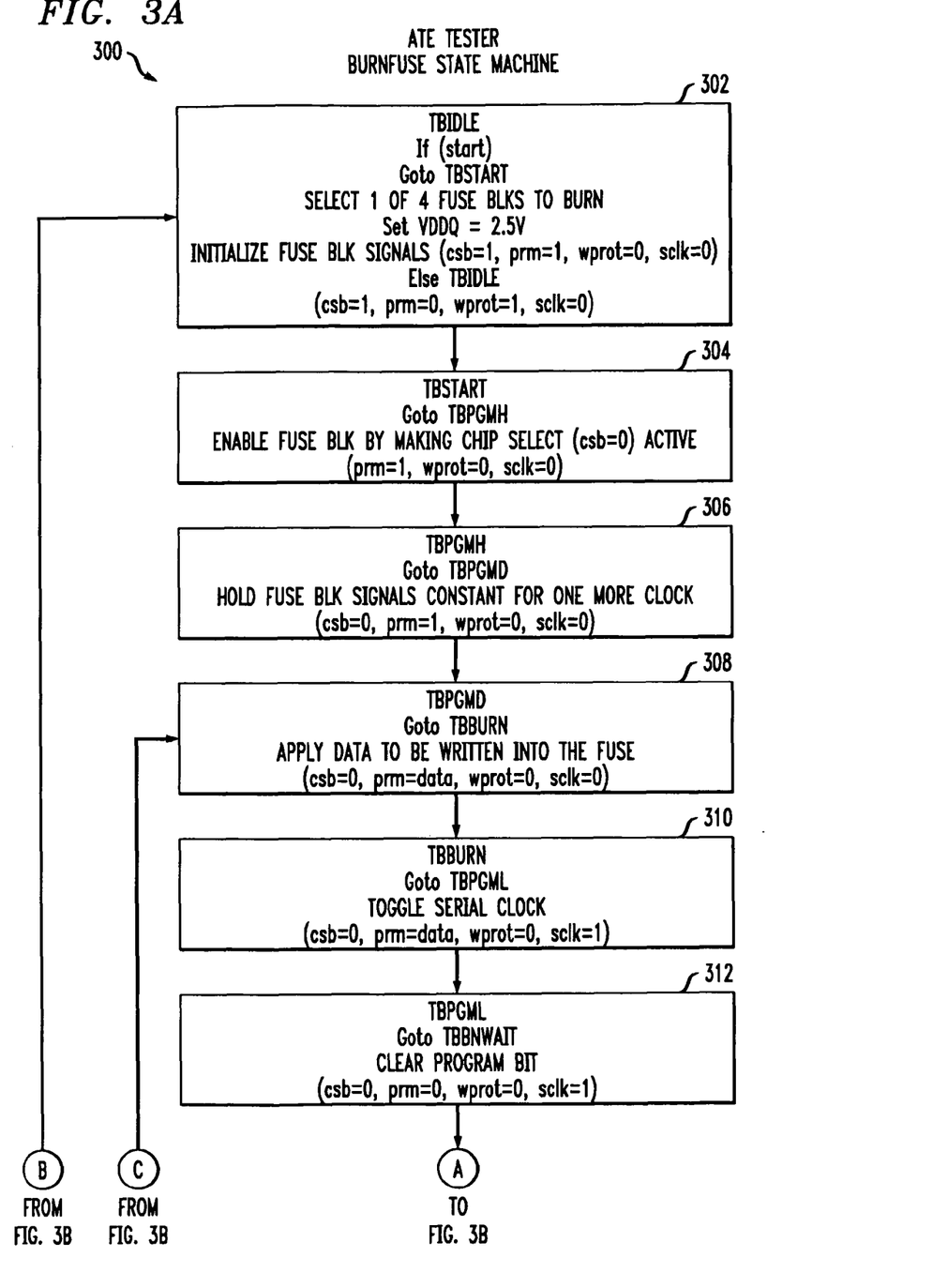
FIGS. 3A and 3B depict a state diagram illustrating an exemplary ATE fuse burn state machine sequencer control/data flow, in accordance with an embodiment of the invention.
Figure 3B:
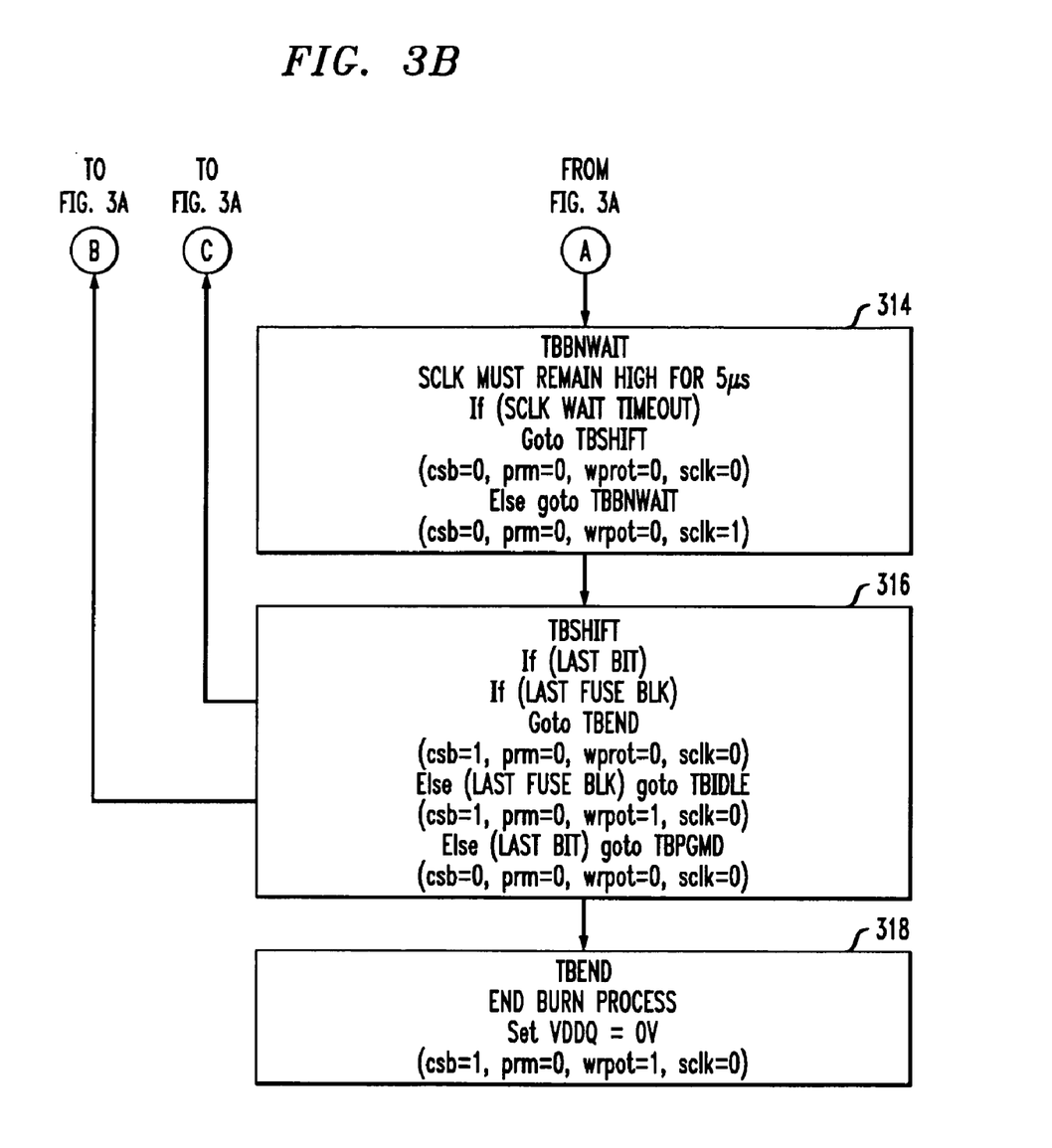

By way of example only, FIGS. 3A and 3B depict an exemplary fuse burn methodology 300 which may be performed, at least in part, by an ATE tester, in accordance with an embodiment of the invention. In this illustrative methodology, it is assumed that there are four fuse blocks (boxes) that can be burned in the memory circuit 100 (see FIG. 1), each fuse block containing 256 bits. It is to be understood, however, that the invention is not limited to any particular number or arrangement of fuse blocks in the memory circuit.

With reference initially to FIG. 3A, the state machine sequencer in the ATE tester preferably begins in an idle state (TBIDLE) 302. In this initial state 302, the ATE tester selects one of the four fuse blocks to burn, since the tester can only burn one fuse block at a time. The ATE tester, in state 302, enables the fuse burn voltage source VDDQ by setting VDDQ to 2.5 volts. It is to be appreciated that the level of the fuse burn voltage source is not limited to 2.5 volts, but that various other voltage levels may be used, as may be appropriate for burning the fuse blocks. All fuse array input signals, namely, chip select csb, program prm, write protect wprot, and serial clock sclk, are preferably controlled by the ATE tester. The ATE tester requires the data to be programmed before starting the burn sequence.

The ATE tester sequencer next transitions to a start state (TBSTART) 304, wherein the fuse array in the memory circuit is enabled, such as, for example, by setting the chip select signal csb to a logic low level (e.g., csb=0). The program signal prm is also set to a logic high level (e.g., prm=1) and the write protect signal wprot is set to a logic low level (e.g., wprot=0). During this time, the serial clock remains low (e.g., sclk=0). The ATE tester sequencer then transitions to a program high state (TBPGMH) 306, wherein the fuse block signals are held constant at least one clock cycle after the assertion of the chip select signal. The ATE tester sequencer then proceeds to a program data state (TBPGMD) 308. In state 308, the correct data bit to be written into the fuse block is asserted from the ATE tester (e.g., prm=data). Next, in a burn state (TBBURN) 310, data from the program signal prm is clocked into the fuse block by asserting the serial clock sclk from a logic low level to a logic high level (e.g., sclk=1). The ATE tester sequencer then proceeds to a program low state (TBPGML) 312. In state 312, as part of the burn sequence for the fuse array, the ATE tester sets the program signal prm to a logic low level (e.g., prm=0) before the serial clock transitions from high to low in order to burn the next fuse bit.

With reference to FIG. 3B, the ATE tester sequencer next advances to a burn wait state (TBBNWAIT) 314, wherein the serial clock sclk remains high for a predetermined amount of time (e.g., about 5 microseconds, which is about 2 clock cycles with the ATE tester running at about 10 megahertz). The ATE tester will wait in this state before advancing to the next state until a burn wait counter has timed out. Once the counter has timed out, the serial clock will transition from a logic high level to a logic low level.

Next, in a serial shift state (TBSHIFT) 316, the ATE tester determines whether all 256 bits have been programmed into the selected fuse block. If not, the ATE tester sequencer will stay in the burn loop and return to state 308. If all 256 fuse bits have been programmed, the ATE tester sequencer will turn off the fuse array chip select (e.g., csb=1) and check to see if all fuse blocks have been programmed. If not all fuse blocks have been programmed, the ATE tester sequencer jumps back to state 302 to select another fuse block and repeat the burn process. If all fuse blocks have been programmed, the ATE tester will turn off the fuse burn voltage source VDDQ, such as by setting VDDQ back to zero volts, and jump to an end state (TBEND) 318, wherein the fuse burn process has been completed. In this embodiment, since the ATE tester controls the fuse array input signals, no acknowledgment signals need be transmitted between the ATE tester and the memory circuit.

Figure 4A:
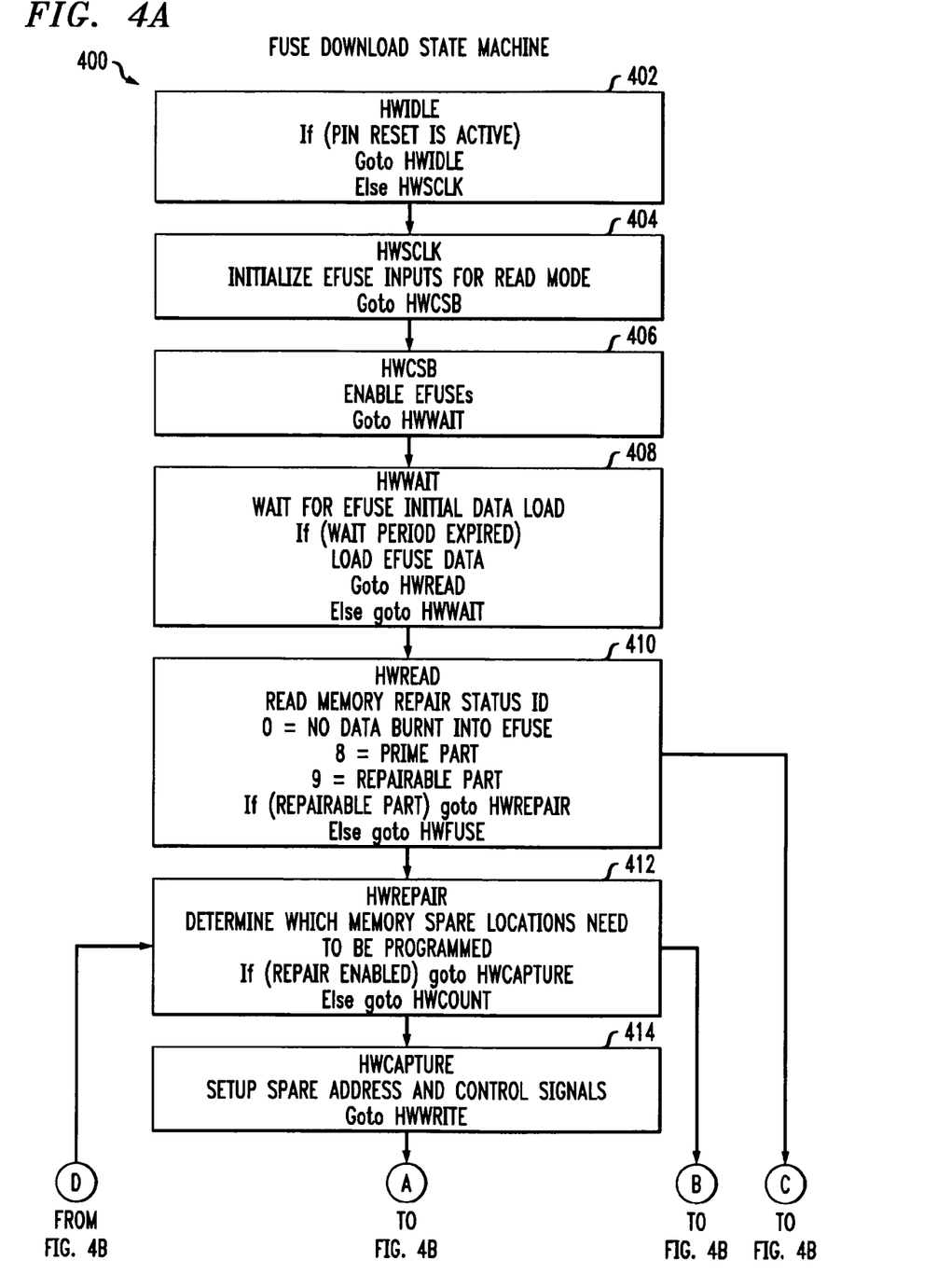
FIGS. 4A and 4B depict a state diagram illustrating an exemplary fuse download state machine sequencer control/data flow which may be implemented in the memory circuit of FIG. 1, in accordance with an embodiment of the invention.
Figure 4B:
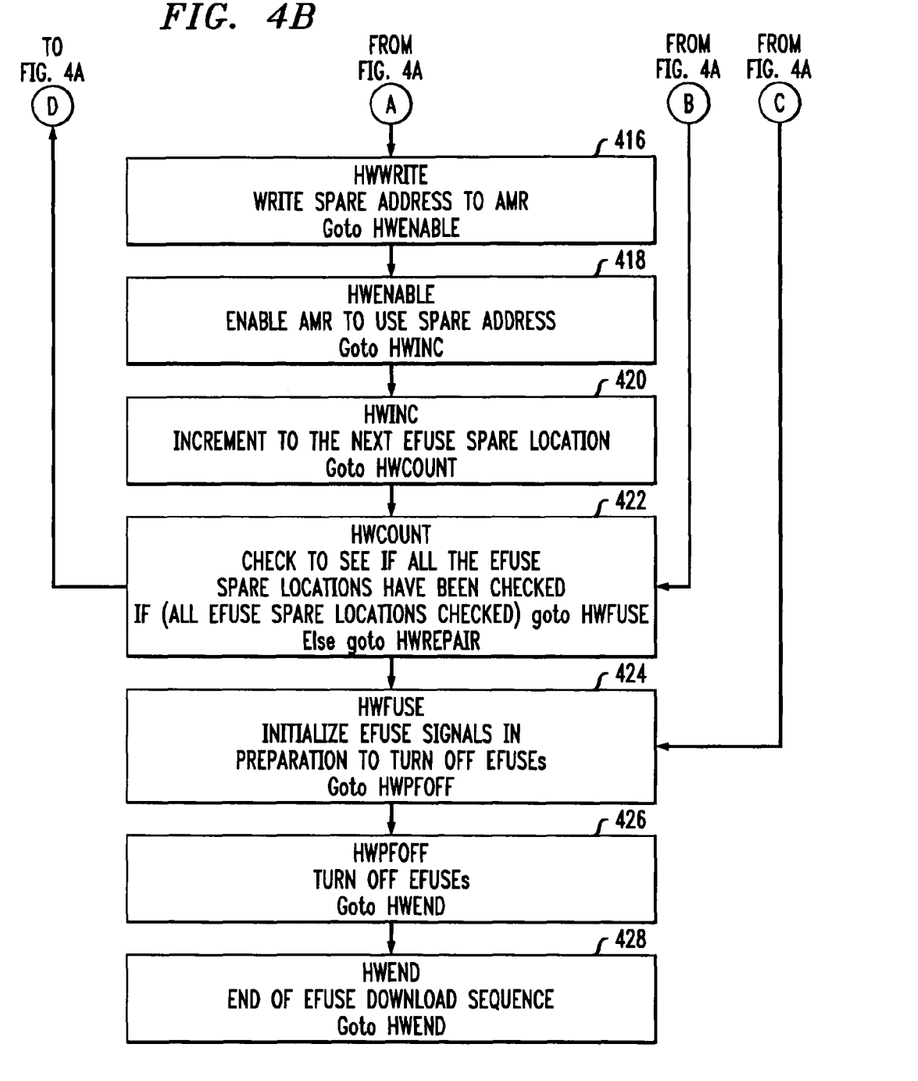

By way of example only, FIGS. 4A and 4B depict an exemplary fuse download methodology 400 which may be performed, at least in part, by second (fuse download) state machine 132 in memory circuit 100 shown in FIG. 1, in accordance with an embodiment of the invention. As previously stated, the fuse download state machine is preferably initiated upon receipt of a pin reset signal, at which point the fuse download sequencer enters a default idle state (HWIDLE) 402. In state 402, the fuse download state machine sequencer checks to see if pin reset is active. If pin reset is active, the sequencer remains in state 402; otherwise, the sequencer transitions to a serial clock high state (HWSCLK) 404, wherein the serial clock is initialized to a logic high level (e.g., sclk=1) for performing a read operation.

The fuse download state machine sequencer next proceeds to an enable fuse array state (HWCSB) 406. In state 406, the sequencer enables the fuse array via the chip select signal csb by setting csb to a logic low level (e.g., csb=0). Next, the fuse download state machine sequencer proceeds to a read wait state (HWWAIT) 408, wherein the sequencer waits for the fuse array data to load. After the chip select is asserted, the sequencer waits for a predetermined number of clock cycles for the fuse array to turn on. Once this timeout period has expired, the sequencer will download the fuse array data into read registers (e.g., in the block of registers 130 in memory circuit 100 of FIG. 1). The sequencer then proceeds to a read repair status state (HWREAD) 410. In state 410, the sequencer will determine from the read data whether or not the chip is repairable. If the chip is repairable, the sequencer will proceed to a memory repair state (HWREPAIR) 412; otherwise, if the chip is not repairable, it is assumed that the chip is prime and the sequencer will jump to a start fuse array power down state (HWFUSE) 424 (see FIG. 4B).

In state 412, the sequencer in the fuse download state machine preferably determines whether the memory spare locations in the AMR circuitry 110, 116, 122, associated with each of the memory subsystems 108, 114, 120, respectively, in the memory circuit 100 (see FIG. 1), need to be programmed. If the memory spare locations do not need to be repaired, the sequencer will increment to the next spare location and jump to the state that is keeping track of which spare location is being processed, namely, a spare location count state (HWCOUNT) 422 (see FIG. 4B). If the current spare location does need to be repaired, the sequencer will transition to a load spare address state (HWCAPTURE) 414, wherein a capture routine will be initiated by the sequencer. In state 414, the fuse download state machine sequencer preferably loads the spare address and control signals corresponding to the location to be repaired.

With reference to FIG. 4B, after loading the spare address and control signals in state 414, the sequencer then proceeds to a write spare address to AMR state (HWWRITE) 416. In state 416, the sequencer will write the spare address to the AMR circuitry in the appropriate embedded memory group. The sequencer then proceeds to an AMR enable state (HWENABLE) 418, wherein the sequencer enables the AMR circuitry to use registers for the spare address location. Next, in an increment to next spare state (HWINC) 420, the sequencer will increment to the next spare address. The sequencer then proceeds to state 422.

In state 422, the fuse download state machine sequencer preferably verify that all spare locations have been checked. If all spare locations have been checked, the sequencer will start a fuse array power down sequence in state 424; otherwise, if all spare locations have not been checked, the sequencer will jump back to state 412 (FIG. 4A) and start the memory repair loop again for the one or more spare locations that have not been checked. In state 424, the sequencer initiates a power down sequence in the fuse array and then proceeds to a power fuse off state (HWPFOFF) 426, wherein the fuse array will be turned off by setting chip select csb inactive (e.g., csb=1). The sequencer then proceeds to an end state (HWEND) 428 wherein the fuse download process is completed. This state will also release the system reset condition.

Figure 5:
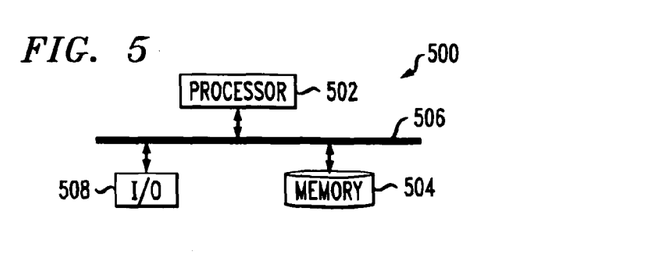
FIG. 5 is a simplified block diagram depicting an exemplary processing system in which techniques of the present invention may be implemented, in accordance with an embodiment of the invention.

The testing methodologies of embodiments of the invention may be particularly well-suited for implementation in an electronic device or alternative system. For example, FIG. 5 is a block diagram depicting an exemplary processing system 500 formed in accordance with an aspect of the invention. System 500 may represent, for example, ATE (e.g., IC tester, IC wafer prober, chip handler, binning equipment, etc.). System 500 may include a processor 502, memory 504 coupled to the processor (e.g., via a bus 506 or alternative connection means), as well as input/output (I/O) circuitry 508 operative to interface with the processor. The processor 502 may be configured to perform at least a portion of the methodologies of the present invention, illustrative embodiments of which are shown in FIGS. 2A-C, 3, 4A and 4B, described herein above.

It is to be appreciated that the term "processor" as used herein is intended to include any processing device, such as, for example, one that includes a central processing unit (CPU) and/or other processing circuitry (e.g., network processor, DSP, microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, one or more output devices (e.g., printer, monitor, etc.) for presenting the results associated with the processor, and/or interface circuitry for operatively coupling the input or output device(s) to the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor 502. In any case, it is to be appreciated that at least a portion of the components shown in FIG. 1 may be implemented in various forms of hardware, software, or combinations thereof, e.g., one or more DSPs with associated memory, application-specific integrated circuit(s), functional circuitry, one or more operatively programmed general purpose digital computers with associated memory, etc. Given the teachings of the invention provided herein, one of ordinary skill in the art will be able to contemplate other implementations of the components of the invention.

At least a portion of the methodologies of the present invention may be implemented in otherwise conventional integrated circuit ATE for performing device verification and/or characterization. Manufacturers of conventional ATE include, but are not limited to, Teradyne Inc., Testmetrix Inc., MOSAID Technologies Inc., ALLTEQ Industries Inc., Schlumberger Ltd., Advantest Corp., and in TEST Corp.

At least a portion of the apparatus and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory repair circuit for repairing one or more failures in an embedded memory, the memory repair circuit comprising:

at least one fuse register;

first state machine circuitry coupled to the fuse register, said first state machine circuitry implementing a first state machine operative: (i) to receive status information regarding the one or more failures in the embedded memory; (ii) to determine whether the memory is repairable based on the status information; (iii) when the memory is deemed repairable, to store an address corresponding to a failed memory cell of the memory; (iv) to burn the address corresponding to the failed memory cell into the fuse register using a voltage source supplied to the memory repair circuit; and (v) to verify that the address corresponding to the failed memory cell was burned into the fuse register; and second state machine circuitry coupled to the fuse register, said second state machine circuitry implementing a second state machine operative: (i) to download information stored in the at least one fuse register into at least one repair register associated with the embedded memory; and (ii) when an address is received in the circuit corresponding to a failed memory instance in the embedded memory, to reroute access to the failed memory instance to the at least one repair register.

2. The circuit of claim 1, wherein the second state machine is operative in a reset mode of the memory repair circuit.

3. The circuit of claim 1, wherein the second state machine is operative upon receiving a reset signal.

4. The circuit of claim 1, wherein the first state machine receives the status information regarding one or more failures in the embedded memory from at least one memory built-in self-test routine automatically performed in the embedded memory.

5. The circuit of claim 1, wherein the first state machine is operative to determine whether or not the memory is repairable by evaluating a number of failures detected in the memory and comparing the number of failures to a prescribed threshold number.

6. The circuit of claim 5, wherein the first state machine is operative to initiate a fuse burning procedure when the number of failures detected in the memory is less than or equal to the prescribed threshold number.

7. The circuit of claim 1, wherein the first state machine is further operative:

(vi) to transmit status information to automated test equipment (ATE) regarding at least one memory built-in self-test procedure performed on the embedded memory; and (vii) to receive from the ATE at least one control signal generated by the ATE in response to the status information, the first state machine initiating a fuse burning procedure to burn the address corresponding to the failed memory cell into the at least one fuse register as a function of the at least one control signal.

8. The circuit of claim 1, wherein the first state machine is further operative:

(vi) to transmit an acknowledgment signal to automated test equipment (ATE) indicating that a fuse burning procedure to burn the address corresponding to the failed memory cell into the fuse register is completed; and (vii) to receive from the ATE at least one control signal generated by the ATE in response to the acknowledgment signal, the first state machine initiating a verification that the address corresponding to the failed memory cell was burned into the fuse register as a function of the at least one control signal.

9. The circuit of claim 1, further comprising an input/output interface operatively coupled to the state machine circuitry, the interface being operative to provide communication between the state machine circuitry and at least one external circuit.

10. The circuit of claim 1, further comprising at least one connection operative to establish communication between at least one of the first and second state machines and at least one automated memory repair circuit corresponding to the embedded memory, the automated memory repair circuit including the at least one repair register.

11. The circuit of claim 1, further comprising adaptive memory repair (AMR) circuitry coupled to the embedded memory, the AMR circuitry being adapted to repair one or more defective memory cells in the embedded memory.

12. The circuit of claim 11, wherein the second state machine is operative to transfer the programmed contents of the at least one fuse register and to distribute the contents to the AMR circuitry to enable the repair of the embedded memory.

13. The circuit of claim 1, further comprising memory built-in self-test (MBIST) controller circuitry, the MBIST controller circuitry being adapted to run one or more procedures for functionally testing the embedded memory and to provide the status information regarding the one or more failures in the embedded memory.

14. The circuit of claim 1, wherein to burn the at least one fuse register, the first state machine is operative in a first mode to apply the voltage source received by the memory circuit to the fuse register for a prescribed period of time, and is operative in a second mode to disable the fuse register from receiving the voltage source.

15. The circuit of claim 1, wherein the first state machine is operative in an idle state in response to a reset of the memory repair circuit, the first state machine, while in the idle state, remaining in the idle state until receiving a control signal from automated test equipment (ATE) to initiate an automated memory repair procedure in the memory circuit.

16. The circuit of claim 1, wherein the first state machine is operative to automatically burn each bit in the at least one fuse register serially as a function of the status information.

17. The circuit of claim 1, wherein the first state machine is operative to automatically burn a plurality of bits in the at least one fuse register concurrently as a function of the status information.

18. An integrated circuit including at least one memory repair circuit for repairing one or more failures in an embedded memory, the memory repair circuit comprising:

at least one fuse register;

first state machine circuitry coupled to the fuse register, said first state machine circuitry implementing a first state machine operative: (i) to receive status information regarding the one or more failures in the embedded memory; (ii) to determine whether the memory is repairable based on the status information; (iii) when the memory is deemed repairable, to store an address corresponding to a failed memory cell of the memory; (iv) to burn the address corresponding to the failed memory cell into the fuse register using a voltage source supplied to the memory repair circuit; and (v) to verify that the address corresponding to the failed memory cell was burned into the fuse register; and second state machine circuitry coupled to the fuse register, said second state machine circuitry implementing a second state machine operative: (i) to download information stored in the at least one fuse register into at least one repair register associated with the embedded memory; and (ii) when an address is received in the circuit corresponding to a failed memory instance in the embedded memory, to reroute access to the failed memory instance to the at least one repair register.

19. The integrated circuit of claim 18, wherein one or more fuses associated with the at least one fuse register are programmed into respective conductivity states in accordance with the status information regarding the one or more failures in the embedded memory.

20. An automated test equipment (ATE) apparatus for use in connection with a memory repair circuit for repairing one or more failures in an embedded memory, the apparatus comprising:

a programmable voltage source; and at least one processor coupled to the programmable voltage source and operative: (i) to generate a first control signal, the first control signal being supplied to the memory repair circuit for initiating an automated memory repair procedure in the memory repair circuit; (ii) to receive, from the memory repair circuit, status information relating to a memory built-in self-test (MBIST) procedure performed on the embedded memory; (iii) to determine, based at least in part on the status information, whether the embedded memory is repairable; (iv) when the embedded memory is determined to be repairable, to set the programmable voltage source to a first voltage level at least equal to a minimum voltage potential suitable for burning at least one fuse register in the memory repair circuit and to generate a second control signal, the second control signal being supplied to the memory repair circuit for initiating an automated fuse burn procedure for programming the at least one fuse register; (v) to receive a first acknowledgment indicating whether the fuse burn procedure has been completed; (vi) in response to the first acknowledgment that the fuse burn procedure has been completed, to set the programmable voltage source to a second voltage level which is less than the minimum voltage potential suitable for burning the at least one fuse register; (vii) to generate a third control signal, the third control signal being supplied to the memory repair circuit for initiating an automated verification procedure in the memory repair circuit for verifying data burned into the at least one fuse register; and (viii) to receive a second acknowledgment indicating a result of the verification procedure.

21. The apparatus of claim 20, wherein the first voltage level is about 2.5 volts and the second voltage level is about zero volt.

22. A system for repairing one or more failures in an embedded memory, the system comprising:

an automated test equipment (ATE) apparatus; and at least one circuit to be tested using the ATE apparatus, the circuit including embedded memory and a memory repair circuit coupled to the embedded memory, the memory repair circuit comprising:

at least one fuse register; and first state machine circuitry coupled to the fuse register, the first state machine circuitry implementing a first state machine operative: (i) to receive status information regarding the one or more failures in the embedded memory; (ii) to determine whether the memory is repairable based on the status information; (iii) when the memory is deemed repairable, to store an address corresponding to a failed memory cell of the memory; (iv) to burn the address corresponding to the failed memory cell into the fuse register using a voltage source supplied to the memory repair circuit by the ATE apparatus; and (v) to verify that the address corresponding to the failed memory cell was burned into the fuse register;

second state machine circuitry coupled to the fuse register, the second state machine circuitry implementing a second state machine operative: (i) to download information stored in the at least one fuse register into at least one repair register associated with the embedded memory; and (ii) when an address is received in the circuit corresponding to a failed memory instance in the embedded memory, to reroute access to the failed memory instance to the at least one repair register.

\* \* \* \* \*